(12) United States Patent
Tosaka et al.

(10) Patent No.: US 11,497,117 B2
(45) Date of Patent: Nov. 8, 2022

(54) METAL-CLAD LAMINATE, PRINTED WIRING BOARD AND SEMICONDUCTOR PACKAGE

(71) Applicant: HITACHI CHEMICAL COMPANY, LTD., Tokyo (JP)

(72) Inventors: Yuji Tosaka, Tokyo (JP); Takeshi Saitoh, Tokyo (JP); Yukio Nakamura, Tokyo (JP); Ryohta Sasaki, Tokyo (JP); Hiroshi Shimizu, Tokyo (JP); Ryoichi Uchimura, Tokyo (JP)

(73) Assignee: Showa Denko Materials Co., Ltd., Tokyo (JP)

( * ) Notice: Subject to any disclaimer, the term of this patent is extended or adjusted under 35 U.S.C. 154(b) by 121 days.

(21) Appl. No.: 16/303,953

(22) PCT Filed: May 24, 2017

(86) PCT No.: PCT/JP2017/019369
§ 371 (c)(1),
(2) Date: Nov. 21, 2018

(87) PCT Pub. No.: WO2017/204249
PCT Pub. Date: Nov. 30, 2017

(65) Prior Publication Data
US 2020/0323078 A1   Oct. 8, 2020

(30) Foreign Application Priority Data
May 25, 2016   (JP) .............................. JP2016-104403

(51) Int. Cl.
*H05K 1/03*   (2006.01)
*B32B 15/08*   (2006.01)
*B32B 15/14*   (2006.01)

(52) U.S. Cl.
CPC ........... *H05K 1/0366* (2013.01); *B32B 15/08* (2013.01); *B32B 15/14* (2013.01)

(58) Field of Classification Search
CPC ........ H05K 1/0366; H05K 1/03; B32B 15/14; B32B 15/08
(Continued)

(56) References Cited

U.S. PATENT DOCUMENTS

| | | | |
|---|---|---|---|
| 2011/0174522 A1* | 7/2011 | Simmons | ................ B32B 5/28 |
| | | | 174/122 R |
| 2017/0017272 A1* | 1/2017 | Morrison | ................ B32B 9/045 |
| 2018/0302721 A1* | 10/2018 | Di | ........................ B32B 5/245 |

FOREIGN PATENT DOCUMENTS

| | | |
|---|---|---|
| CN | 101321813 A | 12/2008 |
| CN | 103347938 A | 10/2013 |

(Continued)

OTHER PUBLICATIONS

Daito Noriyuki, Machine Translation of Japanese Patent Publication No. 2012-167256 (Sep. 6, 2012) (Year: 2012).*

*Primary Examiner* — Tremesha S Willis
(74) *Attorney, Agent, or Firm* — Fitch, Even, Tabin & Flannery, LLP

(57) ABSTRACT

Provided are a metal-clad laminate, a printed circuit board, and a semiconductor package, wherein the warps therein are effectively suppressed. Specifically the metal-clad laminate comprises a prepreg, wherein the prepreg has a resin composition attached to a fiber base material and satisfies a following formula (1) as well as a Mowing formula (2), provided that in the formulae, a1 represents an average thickness of the resin composition after being cured which is present on one surface of the fiber base material; a2 represents an average thickness of the resin composition after being cured which is present on other surface of the
(Continued)

fiber base material; and B represents an average thickness of the fiber base material.

$$0.12 < \{(a1+a2)/2\}/B \quad (1)$$

$$0.8 \leq a1/a2 \leq 1.25 \quad (2)$$

21 Claims, 1 Drawing Sheet

(58) Field of Classification Search
USPC .......................................................... 174/255
See application file for complete search history.

(56) References Cited

FOREIGN PATENT DOCUMENTS

| | | |
|---|---|---|
| JP | 2008-038066 A | 2/2008 |
| JP | 2009-214525 A | 9/2009 |
| JP | 2010-278414 A | 12/2010 |
| JP | 2012-045887 A | 3/2012 |
| JP | 2012-167256 A | 9/2012 |
| JP | 2012-228879 A | 11/2012 |
| JP | 2012-231140 A | 11/2012 |
| JP | 2013-082213 A | 5/2013 |
| JP | 2014-240456 A | 12/2014 |
| JP | 2015-003982 A | 1/2015 |
| JP | 2015-063040 A | 4/2015 |
| JP | 2015-080882 A | 4/2015 |
| JP | 2015-176894 A | 10/2015 |
| TW | 201109359 A | 3/2011 |

\* cited by examiner

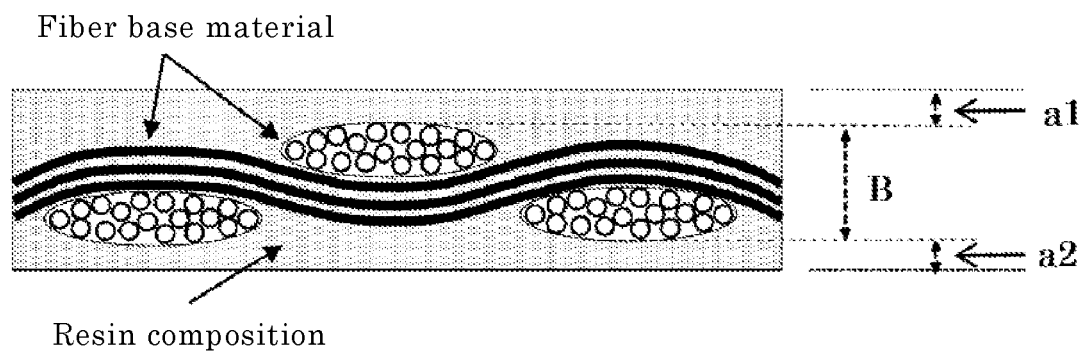

METAL-CLAD LAMINATE, PRINTED WIRING BOARD AND SEMICONDUCTOR PACKAGE

CROSS-REFERENCE TO RELATED APPLICATIONS

This application is a U.S. national phase application filed under 35 U.S.C. § 371 of International Application No. PCT/JP2017/019369, filed May 24, 2017, designating the United States, which claims benefit from Japanese Patent Application 2016-104403, filed May 25, 2016, which are hereby incorporated herein by reference in their entirety.

TECHNICAL FIELD

The present invention relates to a metal-clad laminate, a printed circuit board, and a semiconductor package.

BACKGROUND ART

In view of further simplicity, efficiency, and labor saving, personal goods used in daily life are being electronized, wherein electronic parts used in the electronic equipment are required to be further lighter and smaller in view of the use convenience, etc. Therefore, the printed circuit board used in the electronic parts, too, is made thinner and smaller so that the circuit pattern is being made finer and the insulating layer is being made thinner. In view of the cost and workability, the parts to be mounted become smaller and the pitch thereof are made narrower, so that a warp of the printed circuit board during the time of mounting thereof can be a serious problem. Therefore, conventionally, in order to reduce the difference between the thermal expansion of a base material before and after the reflow soldering and the thermal expansion of the chip to be mounted, the measures such as raising the glass transition temperature of a resin layer included in the base material and lowering the thermal expansion rate of the resin layer have been used to reduce the warp.

In recent years, thinning of the base material and narrowing of the pitch progress, so that further reduction of the warp than ever is started to be wanted. Therefore, among others, the method for suppressing the warp-causing stress by changing a glass cloth to a quartz cloth so as to lower the thermal expansion rate and to enhance the rigidity of the substrate is proposed (see PTL 1).

CITATION LIST

Patent Literature

PTL 1; Japanese Patent Laid-Open Publication No. 2010-278414

SUMMARY OF INVENTION

Technical Problems

However, because the quartz cloth described in PTL 1 is so hard that there is a problem of poor machinability such as drilling and substrate cutting; and thus, development of the method not requiring the quartz cloth as the requisite is waited (however, the present invention does not deny to include the quartz cloth).

Meanwhile, recently in addition to the increase in, among other things, wireless communication equipment using a high-frequency band, because of increase in the communication speed, use of a high-frequency band is inevitably increasing. In the substrate for the high frequency use the transmission loss is so important that a large quantity of a resin composition is attached to the aggregate such as a fiber base material so as to lower a specific dielectric constant. However in this case, because a pore volume of the aggregate is constant, an excessive resin composition is kept on surface of the aggregate as a resin layer; but there still has been a problem of causing a warp.

Therefore, the problem of the present invention is to provide a metal-clad laminate, a printed circuit board, and a semiconductor package, wherein the warps therein are effectively suppressed.

Solution to Problems

Inventors of the present invention carried out an extensive investigation in order to solve the problems mentioned above, and as a result, they presumed that when the ratio of the resin layer occupying the entire prepreg is high, the warp of the substrate is significantly influenced by cure shrinkage of the resin composition present in the front and back sides of the fiber base material; and then, it was found that even if the ratio of the resin layer occupying the entire prepreg is high, by controlling the thicknesses of the resin composition in the front and back sides, the aforementioned problems could be solved even without using a hard fiber base material such as the quartz cloth. On the basis of this finding, the present invention could be completed.

Namely, the present invention provides following [1] to [9].

[1] A metal-clad laminate comprising a prepreg, wherein the prepreg has a resin composition attached to a fiber base material and satisfies a following formula (1) as well as a Mowing formula (2), provided that in the formulae, a1 represents an average thickness of the resin composition after being cured which is present on one surface of the fiber base material; a2 represents an average thickness of the resin composition after being cured which is present on other surface of the fiber base material; and B represents an average thickness of the fiber base material.

$$0.12 < \{(a1+a2)/2\}/B \tag{1}$$

$$0.8 \leq a1/a2 \leq 1.25 \tag{2}$$

[2] The metal-clad laminate according to [1], wherein the fiber base material is a glass cloth.

[3] The metal-clad laminate according to [1] or [2], wherein the average thickness B of the fiber base material in the formula (1) is 5 to 120 µm.

[4] The metal-clad laminate according to any one of [1] to [3], wherein the fiber base material comprises one layer.

[5] The metal-clad laminate according to any one of [1] to [4], wherein the resin composition comprises a thermosetting resin.

[6] The metal-clad laminate according to any one of [1] to [5], wherein the resin composition comprises at least one thermosetting resin selected from a group consisting of an epoxy resin, a phenolic resin, an unsaturated imide resin, a cyanate resin, an isocyanate resin, a benzoxazine resin, an oxetane resin, an amino resin, an unsaturated polyester resin, an allyl resin, a dicyclopentadiene resin, a silicone resin, a triazine resin, and a melamine resin.

[7] The metal-clad laminate according to any one of [1] to [6], wherein a warp amount is 2.0 mm or less as measured with a measurement method, in which a copper foil in an outer layer of the metal-clad laminate is entirely etched to give only a laminate, which is then dried with being placed in a horizontal position while removing water at 80° C. for 2 hours; then, the temperature thereof is resumed to room temperature with being allowed to stand at 20° C.; then, a specimen having the size of 250 mm square is cut out from a center of the laminate thus obtained; then, the specimen is hung down with fixing one angle arbitrarily selected from four angles thereof to measure warp amounts of other three points; and then, all of the four angles are measured with the same procedure, and the largest value thereof is taken as the warp amount.

[8] A printed circuit board comprising the metal-clad laminate according to any one of to [7].

[9] A semiconductor package comprising the printed circuit board according to [8].

Advantageous Effects of Invention

According to the present invention, a metal-clad laminate, a printed circuit board, and a semiconductor package can be provided, wherein the warps therein are effectively suppressed.

BRIEF DESCRIPTION OF DRAWING

FIG. 1 This illustrates a schematic cross section view to explain the prepreg used in the present invention.

DESCRIPTION OF EMBODIMENTS

[Metal-Clad Laminate]

The metal-clad laminate of the present invention comprises a prepreg, wherein the prepreg has a resin composition attached to a fiber base material and satisfies a following formula (1) as well as a following formula (2), wherein.

$$0.12 < \{(a1+a2)/2\}/B \quad (1)$$

$$0.8 \leq a1/a2 \leq 1.25 \quad (2)$$

In the formulae (1) and (2), a1 represents an average thickness of the resin composition after being cured which is present on one surface of the fiber base material; a2 represents an average thickness of the resin composition after being cured which is present on other surface of the fiber base material; and B represent an average thickness of the fiber base material (see FIG. 1).

The measurement methods of a1, a2, and B are not necessarily restricted; however, in the present invention, the values obtained by the methods described below are employed.

(Measurement Methods of a1, a2, and B)

While a prepreg is being hung down in a dryer, temperature of the dryer is raised from 20° C. to 160° C. at the rate of 5° C./hour, then the specimen being kept at 160° C. for 30 minutes is put in a vessel while it is aligned with a thickness tape having a thickness of 0.01 mm measured in accordance with JIS B7524 (2008) [leaf shape: A type].

Next, 100 parts by mass of a bisphenol A liquid epoxy resin and 10 parts by mass of trimethyl tetramine are poured into the vessel with stirring. After having been degassed at the vacuum degree of 700 mmHg (93.3 kPa) for 3 minutes, the resin is cured at 40° C. for 60 minutes and then at 60° C. for 90 minutes. After having been cured, the cured product is taken out from the vessel, and it is cut and mechanically polished to expose the cross section thereof, which is then observed with a scanning electron microscope (SEM) to measure the thickness of the resin composition which is present on one surface of the fiber base material, the thickness of the resin composition which is present on other surface of the fiber base material, and the thickness of the fiber base material.

Measurements are made at 10 portions not having clear scar, dent, or fracture; and an average value thereof is obtained for each of a1 (measured value), a2 (measured value), and B (measured value), which are then corrected as follows to obtain each of a1 (corrected value), a2 (corrected value), and B (corrected value), whereby these values are used as a1, a2, and B in the formulae (1) and (2).

—Correction Method—

The thickness tape having the thickness of 0.01 mm is also observed with a scanning electron microscope (SEM), and the thickness thereof is similarly measured at 10 portions, and thereby the average value thereof is obtained. By using the measured average value and 0.01 mm, the correction coefficient $\alpha$ is obtained by the following formula (3). By multiplying this correction coefficient $\alpha$ to each of a1 (measured value), a2 (measured value), and B (measured value), each of a1 (corrected value), a2 (corrected value), and B (corrected value) is obtained.

$$\alpha = 0.01 \text{ mm/measured average thickness value of thickness tape} \quad (3)$$

$$a1(\text{corrected value}) = a1(\text{measured value}) \times a$$

$$a2(\text{corrected value}) = a2(\text{measured value}) \times a$$

$$B(\text{corrected value}) = B(\text{measured value}) \times a$$

The above correction is made in order to correct the shift of the measured value from the true value, the shift being caused when the prepreg is not cut and mechanically polished perpendicularly to the measuring plane.

Meanwhile, the thickness tape is available from Tokyo Thickness Corp.

The bisphenol A liquid epoxy resin can be expressed by the following formula W.

[Chem. 1]

$$\text{(I)}$$

In the formula (I), $n^1$ represents an integer of 0 to 3, preferably an integer of 0 to 2, while more preferably 0 or 1.

The epoxy equivalent of the bisphenol A liquid epoxy resin is preferably 150 to 500 g/eq, more preferably 150 to 400 g/eq, while still more preferably 150 to 250 g/eq. Meanwhile, the epoxy equivalent is the mass of the resin per the epoxy group (g/eq), which can be measured by the method stipulated in JIS K. 7236 (2009); the same applies hereafter. Specifically, the automatic titration apparatus "GT-200 Type" (manufactured by Mitsubishi Chemical Analytech Co., Ltd.) is used, wherein 90 mL of methyl ethyl ketone is dropped into 2 g of an epoxy resin weighed into a 200 mL beaker; and after the resin is dissolved by an ultrasonic cleaner, 10 mL of glacial acetic acid and 1.5 g of cetyl trimethyl ammonium bromide were added to it, and then, this solution is titrated with 0.1 mol/L of a perchloric acid/acetic acid solution to obtain the epoxy equivalent.

With regard to the bisphenol A liquid epoxy resin, a commercially available product such as "jER (registered trade mark) 815" (manufactured by Mitsubishi Chemical Corp.) may be cited.

The average thickness B of the fiber base material is preferably 5 to 120 μm, more preferably 5 to 100 μm, still more preferably 10 to 100 μm, particularly preferably 10 to 50 μm, while utmost preferably 10 to 30 μm.

The formula (1) is a rough indication of the ratio of the average value of the average thicknesses of the resin composition after being cured which is present in the front and back sides of the fiber base material [(front side average thickness a1+back side average thickness a2)/2] to the fiber base material's average thickness (B). Meanwhile, the front and back sides are not particularly restricted, so that any side may be considered as the front side; the same applies hereafter.

When the ratio of the average value of the average thicknesses of the resin composition after being cured which is present in the front and back sides of the fiber base material to the entire prepreg is above the predetermined value, the cure shrinkage of the resin composition which is present in the front and back sides of the fiber base material has a large effect to the warp of the substrate; therefore, in order to set the condition that causes this problem, the value of $\{(a1+a2)/2\}/B$ in the formula (1) is set to more than 0.12. When this condition is satisfied, it becomes necessary to effectively reduce the warp.

It is more preferable that the prepreg to be used in the present invention satisfy the following formula (1'), though not particularly limited to this.

$$0.12<\{(a1+a2)/2\}/B \leq 0.45 \quad (1')$$

(In the above formula, a1, a2, and B represent the same as those defined before.)

Further, it is preferable that the prepreg to be used in the present invention satisfy the following formula (2'), though not particularly limited to this.

$$0.9 \leq a1/a2 \leq 1.15 \quad (2')$$

The formulae (2) and ((2') specify the ratio of the average thickness of the resin composition after being cured which is present on one (front) surface of the fiber base material to the average thickness of the resin composition after being cured which is present on other (back) surface of the fiber base material, suggesting that the difference between the average thicknesses thereof is small. With this, the difference in cure shrinkages of the resin compositions which are present in the front and back sides of the prepreg can be reduced so that generation of the strain can be effectively suppressed. In addition, even after curing of the resin composition, the difference in the thermal expansion amounts caused by the temperature change can be effectively reduced. Accordingly in the process of room temperature—high temperature treatment—cooling during the time of component mounting, "warp" due to release of the strain at the temperature above the glass transition temperature as well as "warp" due to the difference in thermal expansion amounts by the heating-cooling process can be appropriately suppressed, so that the mounting operation can be made efficiently.

In the past, the attention has been paid how to equalize in the plane the total amount of the resin attached to the fiber base material; and the ratio of the average thickness of the resin composition after being cured which is present on one (front) surface of the fiber base material to the average thickness of the resin composition after being cured which is present on other (back) surface of the fiber base material was prone not to be conscious so much, because it was presumed that this ratio does not have a significant effect to the warp. However, in the case of the prepreg satisfying the formula (1), the effect of this ratio is much larger than expected; and thus, in the present invention, the warp could be effectively reduced by controlling this ratio.

According to the metal-clad laminate of the present invention, the warp amount measured with the measurement method described below can be made to 2.0 mm or less.

(Measurement Method of the Warp Amount)

A copper foil in an outer layer of the metal-clad laminate is entirely etched to give only a laminate, which is then dried with being placed in a horizontal position while removing water at 80° C. for 2 hours; and then, the temperature thereof is resumed to room temperature with being allowed to stand at 20° C., Then, after a specimen having the size of 250 mm square is cut out from a center of the laminate thus obtained, the specimen is hung down with fixing one angle arbitrarily selected from four angles thereof to measure the warp amounts of other three points. Then, all of the four angles are measured with the same procedure, and the largest value thereof is taken as the warp amount.

Hereunder, the fiber base material and the resin composition which are included in the prepreg will be explained.

(Fiber Base Material)

With regard to the fiber base material, heretofore known materials used in various laminates for electric insulation material can be used. Illustrative example of the fiber base material includes natural fibers such as paper and cotton linter; inorganic fibers such as glass fibers and asbestos; organic fibers such as aramid, polyimides, polyvinyl alcohol, polyesters, tetrafluoroethylene, and acryls; and mixtures of them. Among them, in view of flame retardant property, a glass cloth is preferable. Illustrative example of the glass cloth includes a glass cloth using E glass, C glass, D glass, S glass, and the like, or a glass cloth having short fibers bonded with an organic binder; and a mixed fabric of glass fibers and cellulose fibers. More preferable is the glass cloth using E glass.

These fiber base materials have the form of woven fabric, unwoven fabric, roving, chopped strand mat, surfacing mat, or the like, Meanwhile, the material and form thereof are chosen depending on the use or performance of the target shaped material, wherein they may be used singly or, if necessary in a combination of two or more of the material and form thereof.

The two or more of the material and form of the fiber base material may be the same or different with each other. Meanwhile, when two or more of the fiber base material are used, the aforementioned average thickness B of the fiber base material is a sum of the average thicknesses of the two or more of the fiber base material.

The fiber base material is not particularly restricted, whereas the fiber base material formed of one layer may be used. Meanwhile, the fiber base material formed of one layer means the fiber base material formed of only the entangled fibers; and when the fiber base material not been entangled is present, this is classified to the fiber base material formed of multilayers,

[Resin Composition.]

The resin composition is attached to the fiber base material in the prepreg, wherein the resin composition is incorporated into the fiber base material as well as present on the surface of the fiber base material.

It is preferable that the resin composition includes a thermosetting resin. Besides the thermosetting resin, the resin composition may include, if so desired, a curing agent, a curing facilitator, an inorganic filler, an organic filler, a coupling agent, a levelling agent, an anti-oxidant, a flame retardant, a flame retardant adjuvant, a thixotropic agent, a thickener, thixotropy-imparting agent, a flexible material, a surfactant, a photo-polymerization initiator, etc.; and it is preferable to include at least any one selected from the group consisting of these materials.

Hereunder, each component included in the resin composition will be explained in order.

(Thermosetting Resin)

With regard to the thermosetting resin, the thermosetting resin having the melt viscosity thereof changeable with its cure degree in an arbitrary temperature range is preferable, Illustrative example of the thermosetting resin includes an epoxy resin, a phenol resin, a poly imide resin, a cyanate resin, an isocyanate resin, a benzoxazine resin, an oxetane resin, an amino resin, an unsaturated polyester resin, an allyl resin, a dicyclopentadiene resin, a silicone resin, a triazine resin, and a melamine resin. In addition, not particularly limited to the above-mentioned resins, heretofore known thermosetting resins may be used. These may be used singly or concurrently as a mixture of two or more of them, Among them, an epoxy resin and an unsaturated imide resin are preferable in view of a molding property as well as an electric insulating property.

Illustrative example of the epoxy resin includes a cresol novolak epoxy resin, a phenol novolak epoxy resin, a naphthol novolak epoxy resin, an aralkyl novolak epoxy resin, a biphenyl novolak epoxy resin, a bisphenol A epoxy resin, a bisphenol F epoxy resin, a bisphenol S epoxy resin, a bisphenol T epoxy resin, a bisphenol Z epoxy resin, a tetrabromobisphenol A epoxy resin, a biphenyl epoxy resin, a tetramethyl biphenyl epoxy resin, a triphenyl epoxy resin, a tetraphenyl epoxy resins, a naphthol aralkyl epoxy resin, a naphthalenediol aralkyl epoxy resin, a naphthol aralkyl epoxy resin, a fluorene epoxy resin, an epoxy resin having a dicyclopentadiene skeleton, an epoxy resin having a skeleton of an ethylenic unsaturated group, and an alicyclic epoxy resin.

With regard to the epoxy resin, in view of flame retardant property, a halogenated epoxy resin may also be used. These epoxy resins may be used singly or in view of insulating reliability and heat resistance, concurrently as a mixture of two or more of them.

The epoxy equivalent of the epoxy resin is not particularly restricted; however, in view of the heat resistance, the epoxy equivalent is preferably 60 to 400 g/mol, more preferably 70 to 300 g/mol, while still more preferably 80 to 250 g/mol.

Illustrative example of the epoxy resin commercially available includes: as the cresol novolak epoxy resin, "EPICLON (registered trade mark) N-660" (manufactured by DIC Corp.); as the phenol novolak epoxy resin, "EPICLON (registered trade mark) N-770" (manufactured by DIC Corp.); and as the bisphenol A epoxy resin, "EPICLON (registered trade mark) 840S" (manufactured by DIC Corp.); "jER 828EL" and "YL 980" (both manufactured by Mitsubishi Chemical Corp.).

Meanwhile, the epoxy resin is not particularly restricted; however, in order to impart flexibility the epoxy resin which has two or more epoxy groups in its molecular formula as well as in its main chain a structural unit derived from an alkylene glycol having three or more carbon atoms may also be used. In order to further increase the flexibility two or more of the structural unit derived from the alkylene glycol having three or more carbon atoms may be continuously repeated.

With regard to the alkylene glycol having three or more carbon atoms, an alkylene glycol having four or more carbon atoms is preferable. The upper limit of the number of the carbon atom is not particularly limited, but it is preferably 15 or less, more preferably 10 or less, while still more preferably 8 or less.

In addition, in view of a flame retardant property, a halogenated epoxy resin may also be used as the epoxy resin.

With regard to the polyimide resin, a maleimide compound and the like may be cited. With regard to the maleimide compound, a compound having at least two N-substituted maleimide groups in the molecular formula thereof is preferable. In view of solubility into an organic solvent and mechanical strength, the weight-average molecular weight (Mw) of the maleimide compound is preferably 400 to 3,500, more preferably 600 to 1,000, while still more preferably 650 to 950.

With regard to the maleimide compound, a maleimide compound having an aliphatic hydrocarbon group between two arbitrary maleimide groups among plural maleimide groups, or a maleimide compound having an aromatic hydrocarbon group between two arbitrary maleimide groups among plural maleimide groups (hereunder, this is called "the aromatic hydrocarbon group-containing maleimide") may be cited. Among them, the aromatic hydrocarbon group-containing maleimide is preferable in view of a heat resistance, a dielectric property, a glass transition temperature, a thermal expansion coefficient, and a molding property. With regard to the aromatic hydrocarbon group-containing maleimide, it suffices only if the aromatic hydrocarbon group is present between any two maleimide groups selected with an arbitrarily combination thereof.

The maleimide compound is preferably the aromatic hydrocarbon group-containing maleimide compound represented by the following general formula (II).

[Chem. 2]

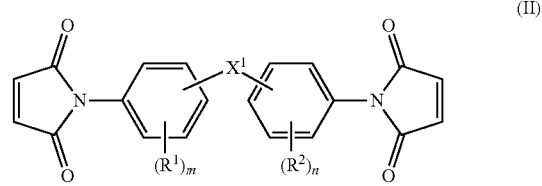

(II)

(In the formula, $R^1$ and $R^2$ each independently represent an aliphatic hydrocarbon group having 1 to 5 carbon atoms or a halogen atom. $X^1$ represents an alkylene group having 1 to 5 carbon atoms, an alkylidene group having 2 to 5 carbon atoms, —O—, —C(=O)—, —S—, —S—S—, or a sulfonyl group. And m and n each independently represent an integer of 0 to 4.)

Illustrative example of the aliphatic hydrocarbon group having 1 to 5 carbon atoms represented by $R^1$ and $R^2$ includes a methyl group, an ethyl group, an n-propyl group, an isopropyl group, an n-butyl group, an isobutyl group, a t-butyl group, and an n-pentyl group. In view of a heat resistance, a dielectric property, a glass transition temperature, a thermal expansion coefficient, and a molding property, the aliphatic hydrocarbon group is preferably an aliphatic hydrocarbon group having 1 to 3 carbon atoms, while more preferably a methyl group and an ethyl group.

Illustrative example of the halogen atom represented by $R^1$ and $R^2$ includes a fluorine atom, a chlorine atom, a bromine atom, and an iodine atom.

Illustrative example of the alkylene group having 1 to 5 carbon atoms represented by $X^1$ includes a methylene group, a 1,2-dimethylene group, a 1,3-trimethylene group, a 1,4-tetramethylene group, and a 1,5-pentamethylene group. In view of a heat resistance, a dielectric property, a glass transition temperature, a thermal expansion coefficient, and a molding property the alkylene group is preferably an alkylene group having 1 to 3 carbon atoms, while more preferably a methylene group.

Illustrative example of the alkylidene group having 2 to 5 carbon atoms represented by $X^1$ includes an ethylidene group, a propylidene group, an isopropylidene group, a butylidene group, an isobutylidene group, a pentylidene group, and an isopentylidene group. Among them, in view of a heat resistance, a dielectric property, a glass transition temperature, a thermal expansion coefficient, and a molding property, an isopropylidene group is preferable.

Among the above options, $X^1$ is preferably the alkylene group having 1 to 5 carbon atoms and the alkylidene group having 2 to 5 carbon atoms, while more preferably the alkylene group having 1 to 5 carbon atoms. A still more preferable group is the one mentioned before.

The maleimide compound is more preferably a maleimide compound modified with a monoamine compound having an acidic substituent and with a diamine compound.

Illustrative example of the acidic substituent of the monoamine compound having an acidic substituent includes a hydroxyl group, a carboxylic group, and a sulfonic acid group, whereas a hydroxyl group is preferable.

Illustrative example of the monoamine compound having an acidic substituent includes o-aminophenol, m-aminophenol, p-aminophenol, o-aminobenzoic acid, m-aminobenzoic acid, p-aminobenzoic acid, o-aminobenzenesulfonic acid, m-aminobenzenesulfonic acid, and p-aminobenzenesulfonic acid, 3,5-dihydroxyaniline, and 3,5-dicarboxyaniline. Among them, in view of solubility and reactivity, m-aminophenol, p-aminophenol, p-aminobenzoic acid, and 3,5-dihydroxyaniline are preferable; and in view of a heat resistance, o-aminophenol, m-aminophenol, and p-aminophenol are preferable. As the monoamine compound having an acidic substituent, m-aminophenol may be selected among them.

With regard to the diamine compound, a diamine compound having at least two benzene rings is preferable, a diamine compound having at least two benzene rings in a straight chain between two amino groups is more preferable, while a diamine compound represented by the Mowing general formula (III) is still more preferable.

[Chem. 3]

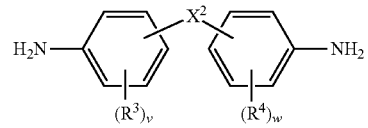

(III)

(In the formula, $X^2$ represents a single bond, an alkylene group having 1 to 5 carbon atoms, an alkylidene group having 2 to 5 carbon atoms, —O—, a sulfonyl group, —C(=O)—, a fluorenylene group, or a phenylene dioxy group. $R^3$ and $R^4$ each independently represent an alkyl group having 1 to 5 carbon atoms, an alkoxy group having 1 to 5 carbon atoms, a halogen atom, a hydroxyl group, a carboxyl group, or a sulfonic acid group. And, v and w each independently represent an integer of 0 to 4.)

Illustrative example of the alkylene group having 1 to 5 carbon atoms represented by $X^2$ includes a methylene group, an ethylene group, a propylene group, and a propylidene group. Among the alkylene groups, an alkylene group having 1 to 3 carbon atoms is preferable, while a methylene group is more preferable.

Illustrative example of the alkylidene group having 2 to 5 carbon atoms represented by $X^2$ includes an ethylidene group, a propylidene group, an isopropylidene group, a butylidene group, an isobutylidene group, a pentylidene group, and an isopentylidene group. Among the alkylidene groups, an isobutylidene group is preferable.

$X^2$ is preferably a single bond, an alkylene group having 1 to 5 carbon atoms, and —O—, while a single bond is more preferable.

Illustrative example of the alkyl group having 1 to 5 carbon atoms represented by $R^3$ and $R^4$ includes a methyl group, an ethyl group, an n-propyl group, an isopropyl group, an n-butyl group, an isobutyl group, a t-butyl group, and an n-pentyl group. The alkyl group is preferably an alkyl group having 1 to 3 carbon atoms, while a methyl group is more preferable.

Illustrative example of the alkoxy group having 1 to 5 carbon atoms represented by $R^3$ and $R^4$ includes a methoxy group, an ethoxy group, and a propoxy group. The alkoxy group is preferably a methoxy group.

Illustrative example of the halogen atom represented by $R^3$ and $R^4$ includes a fluorine atom, a chlorine atom, a bromine atom, and an iodine atom.

Further, v and w each independently represent preferably an integer of 0 to 2, more preferably 0 or 1, while still preferably 1.

Illustrative example of the diamine compound includes 3,3'-dimethyl-4,4'-diamino-1,1'-biphenyl(o-tolidine) and 2,2'-dimethyl-4,4'-diamino-1,1'-biphenyl. Among them, 3,3'-dimethyl-4,4'-diamino-1,1'-biphenyl(o-tolidine) is preferable.

(Curing Agent)

With regard to the curing agent, in the case where the thermosetting resin is the epoxy resin, illustrative example of the curing agent for the epoxy resin includes a phenol type curing agent, a cyanate type curing agent, an acid anhydride type curing agent, an amine type curing agent, and an active ester group-containing compound. Meanwhile, in the case where the thermosetting resin is other than the epoxy resin, curing agents heretofore known for the said thermosetting resin may be used. These curing agents may be used singly or concurrently as a mixture of two or more of them.

With regard to the phenol type curing agent, there is no particular restriction, whereas the preferable, illustrative example thereof includes a cresol novolak type curing agent, a biphenyl type curing agent, a phenol novolak type curing agent, a naphthylene ether type curing agent, and a phenol type curing agent having a triazine skeleton.

The hydroxyl equivalent of the phenol type curing agent is not particularly restricted: however, it is preferably 80 to 150 g/eq, more preferably 80 to 130 g/eq, while still more preferably 90 to 120 g/eq.

Illustrative example of the phenol type curing agent commercially available includes: as the cresol novolak type curing agent, KA-1160, KA-1163, KA-1165 (all manufactured by DIC Corp.), etc.; as the biphenyl type curing agent, MEH-7700, MEH-7810, MEH-7851 (all manufactured by Meiwa Plastic Industries, Ltd.), etc.; as the phenol novolak type curing agent, Phenolite (registered trade mark) TD2090 (manufactured by DIC Corp.), etc.; as the naphthylene ether type curing agent, EXB-6000 (manufactured by DIC Corp.), etc.; and as the phenol type curing agent having a triazine skeleton, LA3018, LA7052, LA7054, LA1356 (all manufactured by INC Corp.), etc.

With regard to the cyanate type curing agent, there is no particular restriction, whereas illustrative example thereof includes bisphenol A dicyanate, polyphenol cyanate [oligo (3-methylene-1,5-phenylenecyanate)], 4,4"-methylenebis(2, 6-dimethylphenylcyanate), 4,4'-ethylidene diphenyl dicyanate, hexafluorobisphenol A dicyanate, 2,2-bis(4 cyanate) phenylpropane, 1,1-bis(4-cyanatephenylmethane), bis(4-cyanate-3,5-dimethylphenyl)methane, 1,3-bis(4-cyanatephenyl-1-(methylethylidene))benzene, bis(4-cyanatephenyl) thioether, and bis(4-cyanatephenyl) ether.

With regard to the acid anhydride type curing agent, there is no particular restriction, whereas illustrative example thereof includes phthalic anhydride, tetrahydrophthalic anhydride, hexahydrophthalic anhydride, methyl tetrahydrophthalic anhydride, methyl hexahydrophthalic anhydride, methyl nadic anhydride, hydrogenated methyl nadic anhydride, trialkyl tetrahydrophthalic anhydride, dodecenyl succinic anhydride, 5-(2,5-dioxotetrahydro-3-furanyl)-3-methyl-3-cyclohexene-1,2-dicarboxylic anhydride, trimellitic anhydride, and pyromellitic anhydride.

With regard to the amine type curing agent, there is no particular restriction, whereas illustrative example thereof includes aliphatic amines such as triethylene tetramine, tetraethylene pentamine, and diethylaminopropylamine; and aromatic amines such as m-phenylene diamine and 4,4'-diaminodiphenylmethane.

In addition, a urea resin, etc., may also be used as the curing agent.

When the resin composition includes the curing agent, the content thereof is preferably 10 to 150 parts by mass, more preferably 10 to 100 parts by mass, while still more preferably 10 to 50 parts by mass, relative to 100 parts by mass of the thermosetting resin.

Meanwhile, when the resin composition includes the curing agent, the content thereof may also be expressed by the equivalent of the functional group thereof; while it is preferable to do so. Specifically; the curing agent is included therein preferably such that (mass of thermosetting resin/equivalent of functional group) is nearly equal to (mass of curing agent/equivalent of thermosetting resin-reactive functional group)×(constant C). The constant C is different depending on the functional group of the curing agent, wherein in the case where the functional group is a phenolic hydroxyl group, it is preferably 0.8 to 1.2; in the case of an amino group, it is preferably 0.2 to 0.4; and in the case of an active ester group, it is preferably 0.3 to 0.6.

In the case where the thermosetting resin is the epoxy resin, the foregoing equation is expressed such that (mass of epoxy resin/equivalent of epoxy group) is nearly equal to (mass of curing agent/equivalent of epoxy-reactive functional group)×(constant C).

(Curing Facilitator)

With regard to the curing facilitator, curing facilitators generally used for curing of the thermosetting resin may be used. For example, in the case where the thermosetting resin is the epoxy resin, illustrative example of the curing facilitator includes: an imidazole compound and a derivative thereof, a phosphorous compound; a tertiary amine compound; and a quaternary ammonium compound. In view of facilitation of the curing reaction, an imidazole compounds and a derivative thereof are preferable.

Specific example of the imidazole compound and the derivative thereof includes: imidazole compounds such as 2-methylimidazole, 2-ethylimidazole, 2-undecylimidazole, 2-heptadecylimidazole, 2-phenylimidazole, 1,2-dimethylimidazole, 2-ethyl-1-methylimidazole-1,2-diethyl imidazole, 1-ethyl-2-methylimidazole, 2-ethyl-4-methylimidazole, 4-ethyl-2-methylimidazole, 1-isobutyl-2-methylimidazole; 2-phenyl-4 methylimidazole, 1-benzyl-2-phenylimidazole, 1-cyanoethyl-2-methylimidazole, 1-cyanoethyl-2-ethylimidazole, 1-cyanoethyl-2-phenylimidazole, 1-cyanoethyl-2-ethyl-4-methylimidazole, 2-phenyl-4,5-dihydroxymethylimidazole, 2-phenyl-4-methyl-5-hydroxymethylimidazole, 2,3-dihydro-1H-pyrro[1,2-a] benzimidazole, 2,4-diamino-6-[2'-methylimidazolyl-(1')] ethyl-s-triazine, 2,4-diamino-6-[2'-undecylimidazolyl-(1')] ethyl-s-triazine, and 2,4-diamino-6-[2'-ethyl-4'-methylimidazolyl-(1')]ethyl-s-triazine; addition reaction products of the above-mentioned imidazole compounds with trimellitic acid, such as 1-cyanoethyl-2-phenylimidazolium trimellitate; addition reaction products of the above-mentioned imidazole compounds with isocyanuric acid; and addition reaction products of the above-mentioned imidazole compounds with hydrobromic acid. These imidazole compounds may be used singly or concurrently as a mixture of two or more of them.

When the resin composition includes the curing facilitator, the content thereof is preferably 0.1 to 20 parts by mass, more preferably 0.1 to 10 parts by mass, while still more preferably 0.1 to 3 parts by mass, relative to 100 parts by mass of the thermosetting resin.

(Inorganic Filler)

By using an inorganic filler, the thermal expansion rate can be decreased, and the film strength can be enhanced. In addition, a non-transmitting property to a light and an abrasion resistance can be enhanced as well. Besides, this is occasionally added in order to increase the volume of the resin composition.

Illustrative example of the inorganic filler includes: oxides such as silica, aluminum oxide, zirconia, mullite, and magnesia; hydroxides such as aluminum hydroxide, magnesium hydroxide, and hydrotalcite; nitride ceramics such as aluminum nitride, silicon nitride, and boron nitride; and natural minerals such as talc, montmorillonite, and saponite, wherein at least any one selected from the group consisting of these inorganic fillers is preferably used, Among them, silica, alumina, and aluminum hydroxide are preferable, while silica and aluminum hydroxide are more preferable.

With regard to the silica, precipitated silica with high water content which is produced with a wet method and dry silica hardly including bound water, etc., which is produced with a dry method may be cited, With regard to the dry silica, depending on difference in the production method thereof, crushed silica, fumed silica, and fused silica (fused spherical silica) may be cited.

The inorganic filler may be treated in the surface thereof with a surface modifying agent such as a silane coupling agent in order to enhance the moisture resistance thereof; and also it may be treated with an agent to make it hydrophobic in order to enhance the dispersion property thereof.

The inorganic filler can be selected appropriately in accordance with the purpose thereof. In view of easiness in forming a fine circuit, specific surface area of the inorganic filler is preferably 1 to 50 $m^2/g$, more preferably 1 to 30 $m^2/g$, while still more preferably 1 to 15 $m^2/g$. The specific surface area of the inorganic filler can be obtained with a measurement method usually used by a person skilled in the art, for example, with a BET method. In the BET method, a molecule whose adsorption occupied area is known is adsorbed onto the powder particle surface at the liquid nitrogen temperature so that the specific surface area of the sample is obtained from the amount thereof. The most frequently used method in the specific surface area analysis is the BET method using an inert gas such as nitrogen.

The average primary particle's diameter of the inorganic filler is preferably 0.1 to 50 μm, more preferably 0.1 to 30 μm, while still more preferably 0.1 to 10 μm. Meanwhile, "average primary particle's diameter" means the average particle's diameter of the single particle not aggregated, in other words it does not mean the average diameter of the aggregated particle, namely not the secondary particle's diameter. The average primary particle's diameter can be obtained by measurement with a laser diffraction particle size distribution analyzer. The average primary particle's diameter is the particle's diameter at the volume of 50% in the cumulative frequency distribution curve of the particle's diameter in which total volume of the particle is taken as 100%.

When the resin composition includes the inorganic filler, the content thereof is preferably 1 to 65% by mass, more preferably 10 to 60% by mass, while still more preferably 25 to 50% by mass, relative to total components of the resin composition (however, an organic solvent is excluded). When the content is 65% or less by mass, viscosity of the resin composition can be kept low so that the workability is enhanced.

Meanwhile, specific gravity of the inorganic filler is wider from small to large as compared with the resin components, so that the content thereof (% by mass) may be expressed with converting it to "% by volume", which takes the specific gravity into account. Namely, it can be said that the content of the inorganic filler is preferably 0.1 to 65% by volume, though different depending on the purpose of addition. For the purposes of coloring and non-transmittance of a light, the amount of 0.1% or more by volume is prone to express sufficient effect. On the other hand, for the purpose to increase the volume, when the volume thereof is kept in the level of 65% or lower by volume, the viscosity during the time of blending of the resin components can be kept not too high, so that the decrease in workability is prone to be easily suppressed. From the same view point, the content of the inorganic filler is more preferably 10 to 60% by volume, while still more preferably 25 to 50% by volume.

(Organic Solvent)

In view of handling easiness, the resin composition may include an organic solvent. In this specification, the resin composition including an organic solvent is sometimes called a resin varnish.

The organic solvent is not particularly restricted, wherein illustrative example thereof includes: alcoholic solvents such as methanol, ethanol, propanol, butanol, methyl cellosolve, butyl cellosolve, propylene glycol monomethyl ether, ethylene glycol monoethyl ether, dipropylene glycol monomethyl ether, dipropylene glycol monoethyl ether, and tripropylene glycol monomethyl ether; ketonic solvents such as acetone, methyl ethyl ketone, methyl isobutyl ketone, butanone, cyclohexanone, and 4-methyl-2-pentanone; ester solvents such as ethyl acetate, butyl acetate, and propylene glycol monomethyl ether acetate; ether solvents such as tetrahydrofuran; aromatic solvents such as toluene, xylene, and mesitylene; nitrogen atom-containing solvents such as N,N-dimethylformamide, N,N-dimethylacetamide, and N-methyl pyrrolidone; and sulfur atom-containing solvents such as dimethyl sulfoxide. Among them, in view of solubility and appearance after coating, ketonic solvents are preferable, wherein cyclohexanone, methyl ethyl ketone, and methyl isobutyl ketone are more preferable, while methyl ethyl ketone is still more preferable.

These organic solvents may be used singly or concurrently as a mixture of two or more of them.

In view of coating easiness, use amount of the organic solvent is controlled, for example, such that content of non-volatile components (these are sometimes called solid components) in the resin composition is preferably 20 to 85% by mass, while more preferably 40 to 80% by mass.

(Preparation Method of Resin Composition)

There is no particular restriction in the preparation method of the resin composition (resin varnish), so that heretofore known methods may be used.

For example, after the above-mentioned components each are added into the organic solvent, they are stirred and mixed by using various mixing machines to prepare the resin composition. Illustrative example of the type of the mixing machine includes an ultrasonic dispersion type, a high-pressure collision dispersion type, a high-speed rotation dispersion type, a bead mill type, a high-speed shearing dispersion type, and a planetary centrifugal dispersion type.

(Production Method of Prepreg)

There is no particular restriction in the production method of the prepreg, so that heretofore known methods for producing the prepreg may be used. For example, the prepreg can be produced in such a way that after the resin composition is impregnated into or applied to the fiber base material, this is subjected to heating or the like so as to be semi-cured (converted to B-stage).

Because the organic solvent is simultaneously removed with curing, the heating temperature upon semi-curing thereof (conversion to B-stage) is equal to or higher than a boiling point of an organic solvent since in this temperature the organic solvent can be efficiently removed; therefore, specifically the temperature is preferably 80 to 200° C., while more preferably 140 to 180° C. Meanwhile, in the present invention, the prepreg obtained by semi-curing (conversion to B-stage) is regarded as the prepreg after being cured. Namely "cure" means to include "semi-cure".

In the alternative production method of the prepreg, for example, after the resin composition is applied onto a releasing film, the resin composition is semi-cured (converted to B-stage) by heating or the like so as to make it to a film form, and then this resin film is laminated to the fiber base material. In view of easiness in satisfying the formula (2), this method is more preferable.

In application of the resin composition, heretofore known coating machines such as a die coater, a comma coater, a bar coater, a kiss coater, and a roll coater may be used. These coating machines may be appropriately chosen in accordance with the intended thickness of the resin film.

With regard to the lamination method, among others, a method in which the resin composition is laminated to the fiber base material under reduced pressure by a roll lamination method, a vacuum lamination method, or the like may be cited. Condition of the roll lamination is, for example, the heating temperature of 50 to 150° C. and the pressure of 0.1 to 1.0 MPa/m. Condition of the vacuum lamination is, for example, the heating temperature of 50 to 150° C., the pressing time of 10 to 120 seconds, and the pressure of 0.1 to 0.5 MPa.

Illustrative example of the releasing film includes: organic films such as polyethylene terephthalate (PET), biaxially drawn polypropylene (OPP), polyethylene, polyvinyl fluoride, and polyimide; metal films such as copper and aluminum, or alloy films of these metals; and these organic or metal films whose surface is treated with a release treatment by a releasing agent. These releasing films may be those which are release-treated with a releasing agent.

Thickness of the entire prepreg may be appropriately controlled in accordance with the thickness of the inner circuit, etc.; however, in view of the molding property and workability the thickness is preferably 10 to 700 µm, more preferably 10 to 500 µm, still more preferably 10 to 250 µm, while particularly preferably 10 to 150 µm.

The metal-clad laminate of the present invention is obtained by using the above-mentioned prepreg, Specifically the metal-clad laminate can be obtained by arranging the metal foils for forming the circuit on both surfaces of the prepreg. With regard to the metal of the metal foil, copper, gold, silver, nickel, platinum, molybdenum, ruthenium, aluminum, tungsten, iron, titanium, and chromium, or alloys including at least one of these metal elements are preferable. With regard to the alloy a copper-based alloy, an aluminum-based alloy, and an iron-based alloy are preferable. With regard to the copper-based alloy, a copper-nickel alloy etc., may be cited. With regard to the iron-based alloy, an iron-nickel alloy (42 alloy), etc., may be cited. Among them, as the metal, copper, nickel, and 42 alloy are preferable; and in view of availability and cost, copper is more preferable. Thickness of the metal foil is not particularly restricted, so that it may be 3 to 210 µm, while it is preferably 5 to 140 µm.

Meanwhile, instead of the metal foil for forming the circuit, a metal foil having the resin layer corresponding to the electroless copper plating which is carried out in a semi-additive process or the like may be arranged. The resin composition included in the resin layer can be explained in the same way as the before-mentioned resin composition, wherein it may be the same as or different from the before-mentioned resin composition. This resin composition is not particularly restricted; however, a composition including an epoxy resin is preferable. The epoxy resin can be explained in the same was as before.

[Printed Circuit Board]

The printed circuit board of the present invention is obtained by using the metal-clad laminate of the present invention.

The printed circuit board of the present invention can be produced by forming a circuit pattern on the metal-clad laminate. The method for forming the circuit pattern is not particularly restricted, wherein illustrative example thereof includes heretofore known methods such as a subtractive process, a full additive process, a semi-additive process (SAP), and a modified semi-additive process (m-SAP).

[Semiconductor Package]

The semiconductor package of the present invention includes the printed circuit board of the present invention; more specifically it is obtained by mounting a semiconductor on the printed circuit board of the present invention. The semiconductor package of the present invention can be produced by mounting a semiconductor chip, a memory etc., in the prescribed position on the printed circuit board of the present invention.

EXAMPLES

Next, the present invention will be explained in more detail by Examples described below; however, these Examples do not restrict the present invention. Meanwhile, by using the prepreg or the copper-clad laminate prepared in each Example, a1, a2, B, and the warp amount were measured by the following methods.

(Measurement Methods of a1, a2, and B)

While a prepreg was hung down in a dryer, temperature of the dryer was raised from 20° C. to 160° C. at the rate of 5° C./hour, then the specimen having been kept at 160° C. for 30 minutes was put in a vessel while it was aligned with a thickness tape (manufactured by Tokyo Thickness Corp.) having a thickness of 0.01 mm measured in accordance with JIS B7524 (2008) [leaf shape: A type].

As the material for the casting resin, 100 parts by mass of a bisphenol A liquid epoxy resin "jER (registered trade mark) 815" (manufactured by Mitsubishi Chemical Corp.) and 10 parts by mass of trimethyl tetramine (manufactured by Wako Pure Chemical Industries, Ltd.) were poured into the vessel with stirring. After having been degassed at the vacuum degree of 700 mmHg (93.3 kPa) for 3 minutes, the resin was cured at 40° C. for 60 minutes and then at 60° C. for 90 minutes. After having been cured, the cured product was taken out from the vessel, and it was cut and mechanically polished to expose the cross section thereof. Then, the cross section was observed with a scanning electron microscope (SEM) to measure the thickness of the resin composition which was present on one surface of the fiber base material, the thickness of the resin composition which was present on other surface of the fiber base material, and the thickness of the fiber base material.

Measurements were made in 10 portions not having clear scar, dent, or fracture; and an average value thereof was obtained for each of a1 (measured value), a2 (measured value), and B (measured value), which were then corrected as follows to obtain each of a1 (corrected value), a2 (corrected value), and B (corrected value whereby these values were used as a1, a2, and B, respectively; in the formulae (1) and (2).

—Correction Method—

The thickness tape having the thickness of 0.01 mm is also observed with a scanning electron microscope (SEM), and similarly to the above, the thickness thereof is measured in 10 portions so as to obtain the average value thereof. By using the measured average value and 0.01 mm, the correction coefficient α is obtained by the following formula (3), By multiplying this correction coefficient α to each of a1 (measured value), a2 (measured value), and B (measured value), each of a1 (corrected value), a2 (corrected value), and B (corrected value) was obtained.

$$\alpha = 0.01 \text{ mm/measured average thickness value of thickness tape} \quad (3)$$

$$a1(\text{corrected value}) = a1(\text{measured value}) \times \alpha$$

$$a2(\text{corrected value}) = a2(\text{measured value}) \times \alpha$$

$$B(\text{corrected value}) = B(\text{measured value}) \times \alpha$$

(Measurement Method of the Warp Amount)

A specimen having the size of 250 mm square was cut out from a center of the metal-clad laminate. The specimen was hung down at 20° C. with fixing one angle arbitrarily selected from four angles thereof to measure the warp amounts of other three points. Then, all of the four angles were measured with the same procedure, and the largest value thereof was taken as the warp amount (with copper foil).

On the other hand; the copper foil in an outer layer of the metal-clad laminate was entirely etched to give only a laminate, which was dried with being placed in a horizontal position with removing water at 80° C. for 2 hours, and then the temperature thereof was resumed to room temperature with being allowed to stand at 20° C. Then, the warp amount (without copper foil) was measured by the same procedure as mentioned above.

Example 1

(Subtractive Process)

With the procedure described below, the prepreg A and the copper-clad laminate were prepared.

(1. Preparation of Resin Varnish A)

Into a vessel were taken 35.8 g of o-tolidine, 469.5 g of bis(4-maleimidephenyl)methane, 35.7 g of m-aminophenol, and 360.0 g of dimethylacetamide; and then, they were caused to react at 100° C. for 2 hours to obtain the polyimide compound-containing solution A (solid component concentration of 60% by mass), wherein the polyimide compound has a biphenyl skeleton in its molecular formula.

Into 50 parts by mass of the above-obtained polyimide compound-containing solution A (solid component concentration of 60% by mass) were added 30 parts by mass of the phenol novolak epoxy resin (trade name: EPICLON (registered trade mark) N-770", manufactured by DIC Corp., epoxy equivalent of 188 g/eq), 20 parts by mass of the cresol novolak resin (trade name: PHENOLITE (registered trade mark) KA-1165, manufactured by Die Corp., hydroxy equivalent 119 g/eq), 30 parts by mass of aluminum hydroxide (trade name: HP-360, manufactured by Showa Denko K.K.) and 90 parts by mass of fused silica (trade name: SC2050-KC, manufactured by Admatechs Co., Ltd., average primary particle's diameter of 0.5 μm, BET specific surface area of 6.8 m$^2$/g) as the inorganic filler, 0.3 parts by mass of the imidazole derivative (trade name: G8009L, manufactured by DKS Co., Ltd.) as the curing accelerator, and methyl ethyl ketone as the diluent; and then, they were mixed to obtain the resin varnish A with the solid component concentration of 65% by mass.

(2. Preparation of Resin Film A)

The resin varnish A thus obtained was applied onto the PET film having the width of 580 mm (trade name: G-2, manufactured by Teijin DuPont Films Japan Ltd.) to obtain the resin film A, wherein the application was controlled such that the coating width thereof would become 525 mm with the thickness of 7 μm after being dried. Meanwhile, viscosity of the resin film A was measured using the rheometer "AR-200 ex" (manufactured by TA Instruments Japan, Inc., temperature raising rate of 3° C./min., jig with 20 mmϕ). The temperature showing the lowest melt viscosity was 128° C.

(3. Preparation of Prepreg A)

Two sheets of the resin film A having been preheated under the condition described below were interposed into a press roll, pressed from both sides of the preheated glass woven clothes (thickness: 15 μm, weight: 13 g/m$^2$, IPC #1017, base material's width: 530 mm, manufactured by Nitto Boseki Co., Ltd.), the fiber base material, so that the resin composition was impregnated under pressure into the fiber base material so as to form a laminate; and then, it was cooled and rolled up with a cooling roll to obtain the prepreg A.

Conditions of the press rolling were: 100° C. as the roll temperature, 0.2 MPa as the line pressure, and 2.0 m/min as the velocity. Meanwhile, the heating was carried out by using a halogen heater (instrument name: UH-USF-CL-700, manufactured by USHIO Inc.). The heating position of the contacting side of the resin film A to the fiber base material was controlled such that central part of the heating surface of the heater was at 30 mm before the press roll, and that the heating temperature in the center of the heating surface was 135° C. as the surface temperature. The fiber base material itself was similarly heated such that the temperature of the fiber base material was controlled so as to be 140° C.

(4. Preparation of Copper-Clad Laminate)

A sheet of the prepreg A was cut to the size of 530 mm square; and then, this was arranged so as to be interposed between the copper foils having the size of 540 mm square (trade name: MT-18EX-5, manufactured by Mitsui Mining & Smelting Co., Ltd.). Next, this was interposed between the SUS-made mirror plates having the thickness of 1.8 mm and the size of 530 mm square, and then heated under a vacuum atmosphere at the temperature raising rate of 2 to 3° C./min in the product temperature range of 60 to 160° C. with the product pressure of 2.5 MPa; and then this was kept at the maximum holding temperature of 220° C. for 90 minutes to prepare the copper-clad laminate A.

The measurement results of each are summarized in Table 1.

Example 2

(Semi-Additive Process)

A sheet of the prepreg A obtained in Example 1 was cut to the size of 530 mm square; and this was interposed between two SAP-corresponding copper foils for the fine circuit having the size of 540 mum square (trade name: PF-EL5, which is the copper foil having a 4-μm thickness resin layer including an epoxy resin; manufactured by Hitachi Chemical Co., Ltd.) such that the resin layer sides thereof were facing to the prepreg A.

Next, this was interposed between the SUS-made mirror plates having the thickness of 1.8 mm and the size of 530 mm square, and heated under a vacuum atmosphere at the temperature raising rate of 2 to 3° C./min in the product temperature range of 60 to 160° C. with the product pressure of 2.5 MPa; and then, this was kept at the maximum holding temperature of 220° C. for 90 minutes to obtain the laminate attached with the SAP-corresponding resin layer.

The copper foil in the outer layer of the laminate attached with the SAP-corresponding resin layer thus obtained was removed by etching so as to expose the SAP-corresponding resin layer. Next, the desmear treatment thereof was carried out by using the desmear solution (manufactured by Atotech B.V.) under the standard condition. Thereafter, the electroless copper plating was carried out by using the electroless copper plating solution (manufactured by Atotech B.V.) under the standard condition, which was further followed by the electric copper plating until the copper thickness of 20 μm to prepare the copper-clad laminate B.

Example 3

The resin varnish A was prepared in the same way as Example 1.

The resin varnish A thus obtained was applied onto the PET film having the width of 580 mm (trade name: G-2, manufactured by Teijin DuPont Films Japan Ltd.) to obtain the resin film C by controlling the application in such a way that the width thereof would become 525 mm with the thickness of 50 µm after being dried. The temperature showing the lowest melt viscosity of this resin film was 121° C.

This was laminated to the glass woven cloth (thickness: 88 µm, weight: 104 g/m², IPC #2116, base material's width: 530 mm, manufactured by Nitto Boseki Co., Ltd.), the fiber base material, in the same way as Example 1 to prepare the prepreg C.

One sheet of the prepreg C thus obtained was processed in the same way as Example 1 except that the temperature raising rate in the product temperature range of 60 to 160° C. was changed to 1.0 to 1.5° C./min to prepare the copper-clad laminate C. The measurement results of each are summarized in Table 1.

Comparative Example 1

The copper-clad laminate D was prepared in the same way as Example 1 except that in preparation of the resin film A, two films were prepared, namely, the resin film D1 was prepared such that the thickness thereof after being dried would be controlled to 7 µm and the resin film D2 was prepared such that the thickness thereof after being dried would be controlled to 10 µm, and thereby in preparation of the prepreg A, in place of two sheets of the resin film A, the resin films D1 and D2 were used. The measurement results of each are summarized in Table 1.

Comparative Example 2

The copper-clad laminate E was prepared in the same way as Example 3 except that in preparation of the resin film C, two films were prepared, namely, the resin film E1 was prepared such that the thickness thereof after being dried would be controlled to 25 µm and the resin film E2 was prepared such that the thickness thereof after being dried would be controlled to 50 µm, and thereby in preparation of the prepreg A, in place of two sheets of the resin film A, the resin films E1 and E2 were used. The measurement results of each are summarized in Table 1.

Reference Example 1

The copper-clad laminate F was prepared in the same way as Example 3 except that in preparation of the resin film C, the resin film F was prepared such that the thickness thereof after being dried would be controlled to 25 µm, and thereby in preparation of the prepreg A, in place of two sheets of the resin film A, two sheets of the resin film F were used. The measurement results of each are summarized in Table 1.

|  |  | $a1$ (µm) | $a2$ (µm) | $B$ (µm) | (1) $\{(a1+a2)/2\}/B$ | (2) $a1/a2$ | Warp amount (mm) With copper foil | Warp amount (mm) Without copper foil |
|---|---|---|---|---|---|---|---|---|
| Example | 1 | 1.8 | 2 | 15 | 0.13 | 0.90 | 0.3 | 0.5 |
|  | 2 | 5.8 | 6 | 15 | 0.39 | 0.97 | 0.5 | 0.6 |
|  | 3 | 26 | 23 | 88 | 0.28 | 1.13 | 1.2 | 1.8 |

|  |  | $a1$ (µm) | $a2$ (µm) | $B$ (µm) | (1) $\{(a1+a2)/2\}/B$ | (2) $a1/a2$ | Warp amount (mm) With copper foil | Warp amount (mm) Without copper foil |
|---|---|---|---|---|---|---|---|---|
| Comparative Example | 1 | 2 | 4 | 15 | 0.20 | 0.50 | 3.5 | 5.6 |
|  | 2 | 9 | 16 | 88 | 0.14 | 0.56 | 24 | 79 |
| Reference Example | 1 | 1 | 3 | 88 | 0.02 | 0.33 | 0.8 | 1.3 |

In Examples 1 and 2, as compared with. Comparative Example 1, the warp amount was significantly reduced in both with and without the copper foil. In Example 3, too, as compared with Comparative Example 2, the warp amount was significantly reduced in both with and without the copper foil.

Meanwhile, in Reference Example 1, it is presumed as follows. Namely, the average thicknesses a1 and a2 of the resin composition which is present on the surface of the fiber base material are thinner as compared with the fiber base material, namely, the ratio of the resin composition to the entire prepreg is so small that the strain to the base material due to the difference between the front and back sides is small thereby resulting in the small effect to the warp amount. Because the effect to the problem of reducing the warp amount is so small, this cannot lead to the effective solution. It is shown that only under the condition that the formula (1) is fulfilled, the effect of the present invention in reduction of the warp amount can be expressed.

REFERENCE SIGNS LIST a1: Average thickness of the resin composition after being cured which is present on one surface of the fiber base material
a2: Average thickness of the resin composition after being cured which is present on other surface of the fiber base material
B: Average thickness of the fiber base material

The invention claimed is:

1. A metal-clad laminate comprising:
a prepreg, wherein the prepreg has a resin composition attached to a fiber base material, the resin composition including an inorganic filler in a content of 10 to 65% by mass relative to total components of the resin composition, the inorganic filler consisting of inorganic filler having an average primary particle's diameter of 0.5 to 50 µm, wherein the prepreg satisfies a following formula (1) as well as a following formula (2), provided that in the formulae (1) and (2), a1 represents an average thickness of the resin composition after being cured which is present on one surface of the fiber base material; a2 represents an average thickness of the resin composition after being cured which is present on other surface of the fiber base material; and B represents an average thickness of the fiber base material:

$$0.12 < \{(a1+a2)/2\}/B \tag{1}$$

$$0.8 \leq a1/a2 \leq 1.25 \tag{2}$$

and
a metal layer provided on each of opposed surfaces of the prepreg.

2. The metal-clad laminate according to claim 1, wherein the fiber base material is a glass cloth.

3. The metal-clad laminate according to claim 1, wherein the average thickness B of the fiber base material in the formula (1) is 5 to 120 μm.

4. The metal-clad laminate according to claim 1, wherein the fiber base material comprises one layer.

5. The metal-clad laminate according to claim 1, wherein the resin composition comprises a thermosetting resin.

6. The metal-clad laminate according to claim 1, wherein the resin composition comprises at least one thermosetting resin selected from a group consisting of an epoxy resin, a phenolic resin, an unsaturated imide resin, a cyanate resin, an isocyanate resin, a benzoxazine resin, an oxetane resin, an amino resin, an unsaturated polyester resin, an allyl resin, a dicyclopentadiene resin, a silicone resin, a triazine resin, and a melamine resin.

7. The metal-clad laminate according to claim 1, wherein a warp amount is 2.0 mm or less as measured with a measurement method, in which a copper foil in an outer layer of the metal-clad laminate is entirely etched to give only a laminate, which is then dried with being placed in a horizontal position while removing water at 80° C. for 2 hours; then, the temperature thereof is resumed to room temperature with being allowed to stand at 20° C.; then, a specimen having the size of 250 mm square is cut out from a center of the laminate thus obtained; then, the specimen is hung down with fixing one angle arbitrarily selected from four angles thereof to measure warp amounts of other three points; and then, all of the four angles are measured with the same procedure, and the largest value thereof is taken as the warp amount.

8. A printed circuit board comprising the metal-clad laminate according to claim 1.

9. A semiconductor package comprising the printed circuit board according to claim 8.

10. The metal-clad laminate according to claim 1, wherein the prepreg satisfies a following formula (2'):

$$0.9 \leq a1/a2 \leq 1.15 \tag{2'}$$

11. The metal-clad laminate according to claim 1, wherein the prepreg satisfies a following formula (1'), and the average thickness B of the fiber base material is 5 to 50 μm:

$$0.12 < \{(a1+a2)/2\}/B \leq 0.45 \tag{1'}$$

12. The metal-clad laminate according to claim 11, wherein the fiber base material is a glass cloth.

13. The metal-clad laminate according to claim 11, wherein the average thickness B of the fiber base material in the formula (1) is 5 to 120 μm.

14. The metal-clad laminate according to claim 11, wherein the fiber base material comprises one layer.

15. The metal-clad laminate according to claim 11, wherein the resin composition comprises a thermosetting resin.

16. The metal-clad laminate according to claim 11, wherein the resin composition comprises at least one thermosetting resin selected from a group consisting of an epoxy resin, a phenolic resin, an unsaturated imide resin, a cyanate resin, an isocyanate resin, a benzoxazine resin, an oxetane resin, an amino resin, an unsaturated polyester resin, an allyl resin, a dicyclopentadiene resin, a silicone resin, a triazine resin, and a melamine resin.

17. The metal-clad laminate according to claim 11, wherein a warp amount is 2.0 mm or less as measured with a measurement method, in which a copper foil in an outer layer of the metal-clad laminate is entirely etched to give only a laminate, which is then dried with being placed in a horizontal position while removing water at 80° C. for 2 hours; then, the temperature thereof is resumed to room temperature with being allowed to stand at 20° C.; then, a specimen having the size of 250 mm square is cut out from a center of the laminate thus obtained; then, the specimen is hung down with fixing one angle arbitrarily selected from four angles thereof to measure warp amounts of other three points; and then, all of the four angles are measured with the same procedure, and the largest value thereof is taken as the warp amount.

18. A printed circuit board comprising the metal-clad laminate according to claim 11.

19. A semiconductor package comprising the printed circuit board according to claim 18.

20. The metal-clad laminate according to claim 11, wherein the prepreg satisfies a following formula (2'):

$$0.9 \leq a1/a2 \leq 1.15 \tag{2'}$$

21. The metal-clad laminate according to claim 1, wherein the content of the inorganic filler is 10 to 60% by mass relative to total components of the resin composition.

* * * * *